United States Patent
Canella

Patent Number: 6,135,291
Date of Patent: Oct. 24, 2000

[54] VERTICAL MAGAZINE METHOD FOR INTEGRATED CIRCUIT DEVICE DISPENSING, RECEIVING, STORING, TESTING OR BINNING

[75] Inventor: Robert L. Canella, Meridian, Id.

[73] Assignee: Micron Electronics, Inc., Nampa, Id.

[21] Appl. No.: 09/008,228

[22] Filed: Jan. 16, 1998

[51] Int. Cl.[7] .............................. B07C 5/344; B07C 5/00; B07C 7/00

[52] U.S. Cl. ........................... 209/573; 209/571; 209/630

[58] Field of Search .................................. 209/571, 573, 209/630, 702, 942

[56] References Cited

U.S. PATENT DOCUMENTS

| | | |
|---|---|---|
| 3,552,590 | 1/1971 | Zachmeier . |
| 4,077,557 | 3/1978 | Green . |
| 4,253,585 | 3/1981 | Janisiewicz et al. . |
| 4,354,787 | 10/1982 | Gensike et al. . |
| 4,412,550 | 11/1983 | Watanabe et al. . |
| 4,460,108 | 7/1984 | Noda et al. . |
| 4,483,441 | 11/1984 | Akizawa et al. . |
| 4,494,902 | 1/1985 | Kuppens et al. . |
| 4,564,326 | 1/1986 | Roberts et al. . |
| 4,588,342 | 5/1986 | Hirokawa et al. . |
| 4,603,248 | 7/1986 | O'Connor . |
| 4,632,621 | 12/1986 | Cable . |
| 4,647,269 | 3/1987 | Wedel et al. . |
| 4,660,710 | 4/1987 | Swapp et al. . |
| 4,694,964 | 9/1987 | Ueberreiter ............................. 209/573 |
| 4,703,858 | 11/1987 | Ueberreiter et al. . |
| 4,715,501 | 12/1987 | Sato et al. ................................ 209/573 |
| 4,724,965 | 2/1988 | Willberg . |
| 4,759,435 | 7/1988 | Cedrone . |
| 4,836,797 | 6/1989 | Riechelmann . |
| 4,846,345 | 7/1989 | Hamuro et al. . |
| 4,878,801 | 11/1989 | Pearson . |
| 4,889,229 | 12/1989 | Yamamoto et al. . |
| 4,926,118 | 5/1990 | O'Connor et al. . |
| 4,953,749 | 9/1990 | Kubota et al. . |
| 4,964,808 | 10/1990 | Riechelmann . |
| 4,979,640 | 12/1990 | Konishi et al. . |
| 5,080,258 | 1/1992 | Hinterreiter . |
| 5,142,771 | 9/1992 | Merkt et al. . |
| 5,143,253 | 9/1992 | Takahashi et al. . |
| 5,165,837 | 11/1992 | Schuppert, Jr. et al. . |
| 5,190,431 | 3/1993 | Klug et al. . |
| 5,207,350 | 5/1993 | Spanton . |
| 5,208,529 | 5/1993 | Tsurishima et al. . |
| 5,307,011 | 4/1994 | Tani ........................................ 209/573 |
| 5,645,393 | 7/1997 | Ishi . |
| 5,743,428 | 4/1998 | Rankin . |
| 5,831,856 | 11/1998 | Lin .......................................... 209/573 |

FOREIGN PATENT DOCUMENTS

| | | |
|---|---|---|
| 56-12223 | 2/1981 | Japan . |
| 4-116022 | 4/1992 | Japan . |

*Primary Examiner*—Donald P. Walsh
*Assistant Examiner*—Brett C. Martin
*Attorney, Agent, or Firm*—Trask Britt

[57] ABSTRACT

A method for dispensing, receiving, storing, testing or binning packaged integrated circuit devices using at least one vertically-oriented, removable, tubular magazine disposed above a controllably-driven, rod-like indexing element extending from a drive below the magazine. A magazine, with an associated indexing element and drive, is configurable as an individual magazine module. The indexing element, under power of the drive, raises or lowers a vertical stack of devices to a desired level adjacent the top of the magazine to dispense or receive an individual device from a feed mechanism, such as a pick-and-place mechanism. A number of magazine modules may be assembled in a multi-module array, which is particularly suitable for binning tested devices, with a sort category being directed to each magazine.

23 Claims, 4 Drawing Sheets

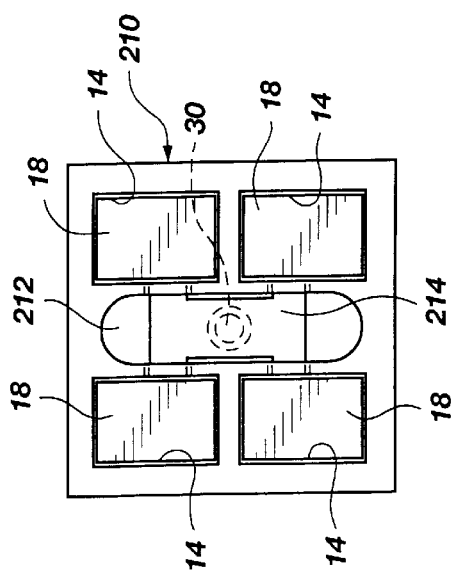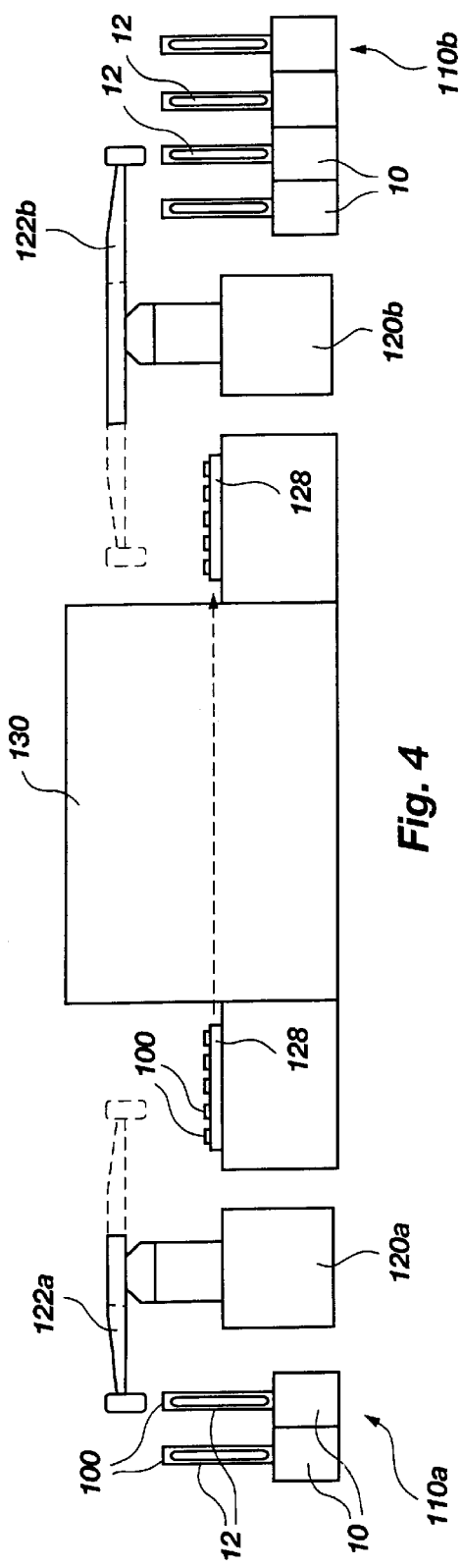

VERTICAL MAGAZINE METHOD FOR INTEGRATED CIRCUIT DEVICE DISPENSING, RECEIVING, STORING, TESTING OR BINNING

RELATED APPLICATIONS

This application contains subject matter related to U.S. patent application Ser. No. 008,228, filed on even date herewith and entitled Vertical Magazine Apparatus for Integrated Circuit Device Dispensing, Receiving or Storing, by the same inventor.

BACKGROUND OF THE INVENTION

The invention relates to methods for optionally dispensing, receiving or storing semiconductor devices including integrated circuits and, more specifically, to methods employing vertical stacking of such devices in magazines.

As the semiconductor industry advances in the fabrication and processing of packaged semiconductor devices (sometimes referred to herein for convenience as "devices"), such as thin small outline packages, or TSOPs, testing and sorting of such devices pose challenges in terms of device throughput, test equipment space utilization, and device distribution responsive to test result-responsive sorting.

Currently, processing of thin package devices such as TSOPs is primarily carried out based upon specialized JEDEC (Joint Electronic Device Engineering Council)—specification trays, which are approximately five inches wide by twelve inches long. The JEDEC tray design dictates that the semiconductor devices are carried in a single layer, arranged in mutually perpendicular rows and columns. Tray density, or the number of devices carried by each tray, obviously decreases as device size increases. For reference purposes, if a given device is 0.400 inch wide by 0.750 inch long, a JEDEC tray part capacity, with a nine row by thirteen column configuration, is about 117 parts per tray.

Testing of the devices is conventionally carried out in batches of thirty-two parts (devices) run through a test cycle simultaneously. The devices are then sorted into a number of categories based upon test results and then "binned" into the aforementioned JEDEC trays by a conventional "pick-and-place" robotic arm system. At the present time, as many as sixteen sort categories are employed, and it is anticipated that the number of sort categories will increase as the sophistication and miniaturization of semiconductor devices continue in the future. If each JEDEC tray employed for receiving post-test devices is intended to receive a single bin or sort category, a substantial amount of manufacturing floor space is required to accommodate an arrangement where sixteen JEDEC trays are placed in a horizontal array. Further, the size and complexity of the pick-and-place device required to place tested devices in the trays of such an array become unreasonable. Alternatively, if (for example) sixteen JEDEC trays are stacked in a holding tower in a vertical format, wherein the trays themselves are again horizontally oriented but mutually vertically superimposed, a tray retrieval and presentation mechanism is required. Further, the time to retrieve each tray from the tower, present it for pick-and-placement of a tested device, and replace the tray in the tower severely limits device throughput. As the number of sort categories increases, each of the foregoing approaches to device binning becomes ever-more unwieldy to execute.

Thus, the prior art approach to semiconductor device sorting and binning has demonstrated severe deficiencies in terms of throughput, space utilization, and complexity of required device handling equipment.

BRIEF SUMMARY OF THE INVENTION

The present invention affords a simple, elegant and economical solution to the previously-identified problems with device sorting and binning. By employing a vertical binning approach instead of the prior art horizontal binning approach, embodiments of the present invention offer the ability to simulate the horizontal spatial configuration or "footprint" of a JEDEC tray for convenience of use with conventional, unmodified robotic pick and place equipment. Additional embodiments of the invention enable the binning of tested and sorted devices into an extremely high number of categories in a rapid, accurate manner and subsequent storage, transport and dispensing of the binned devices for subsequent operations.

One embodiment of the invention includes at least one elongated magazine configured for containing a plurality of semiconductor devices, including by way of example thin package devices, in a stacked configuration. The magazine is mounted substantially vertically and removably associated with an indexing element of an elevation assembly, the indexing element being movable to regulate the internal longitudinal volume of the interior of the magazine, in order to receive or present a device at a desired level proximate the top of the magazine from a stack of devices within the magazine. The indexing element may be driven by a stepper motor or other incrementally or continuously controllable drive employed in the elevation assembly to ensure presentation or receipt of the top device in the magazine at a correct, controllable vertical height for easy access by a pick and place system. The magazine and elevation assembly together may be said to comprise a magazine unit.

It is currently contemplated that a best mode of implementation of the invention may involve a plurality of magazine units in modular form placed in an array, each including a removable, vertically extending magazine placed in close mutual horizontal proximity and, if desired, in a pattern to simulate at least some of the rows and columns exhibited by the aforementioned JEDEC trays. Thus, each magazine is associated with an indexing element responsive to a separately-controllable drive of a discrete elevation assembly for raising or lowering a stack of devices within that magazine to either present an uppermost device in a magazine stack for retrieval, or to lower an uppermost device in a stack to provide a location for placement of another device in that magazine.

Embodiments of the invention also include a method of binning devices and a method of dispensing stored devices for further handling.

BRIEF DESCRIPTION OF THE SEVERAL VIEWS OF THE DRAWINGS

FIG. 1A is a top elevation of the magazine depicted in FIG. 1;

FIG. 1B is a side sectional elevation of a mid-portion of the magazine depicted in FIG. 1;

FIG. 3 is a top view of a single magazine embodiment configured for containment of multiple vertical stacks of devices;

FIG. 4 is a schematic depicting dispensing, testing, and binning of devices according to the present invention;

DETAILED DESCRIPTION OF THE INVENTION

Figure 1:
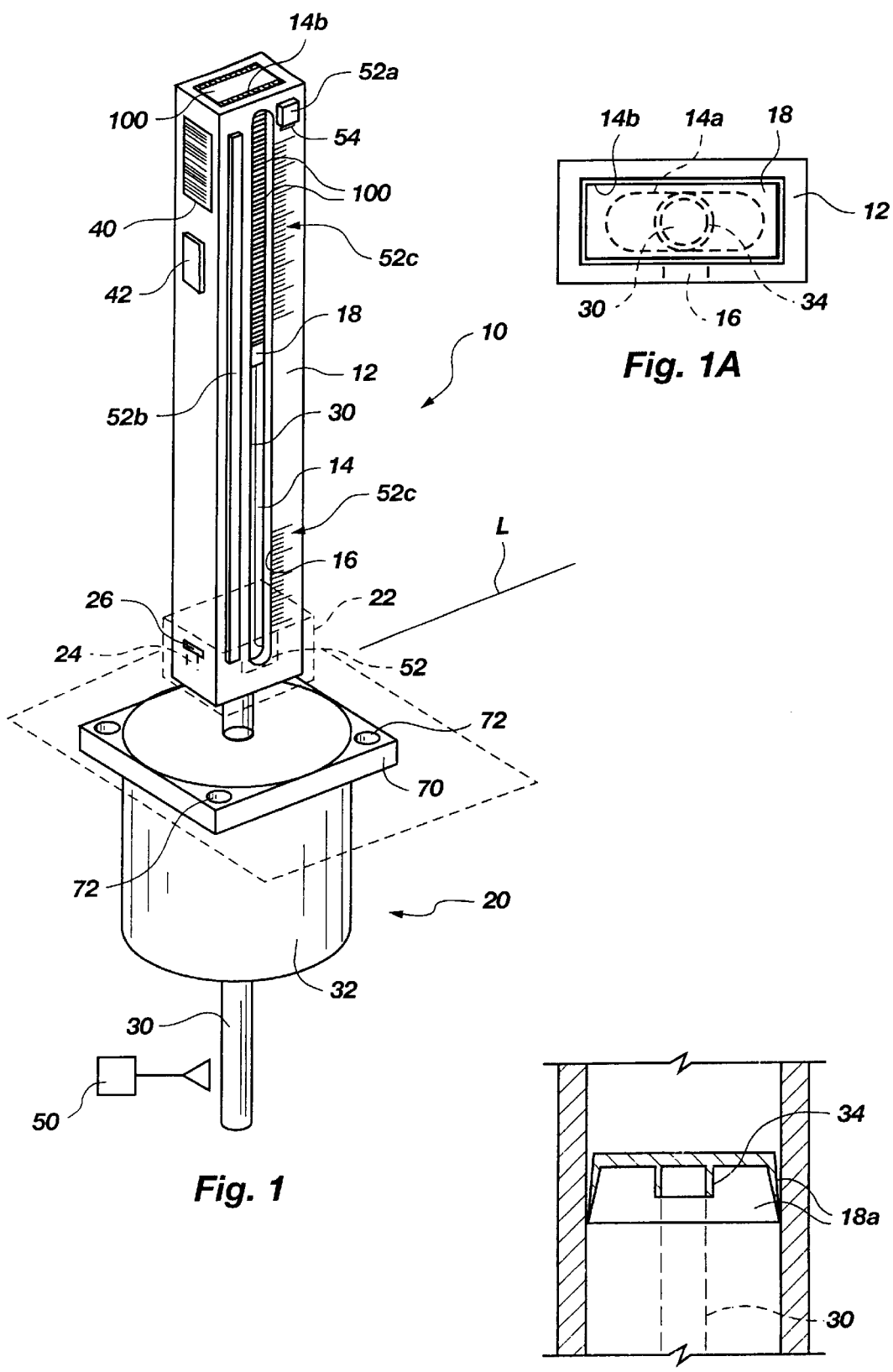
FIG. 1 is a perspective view of a single magazine module embodiment of the invention.

Referring to FIG. 1, magazine unit 10 comprises an elongated, generally tubular magazine 12 defining an interior cavity 14, the cross section of which may be varied in size and shape responsive to that of the devices 100 (such as the aforementioned TSOPs) to be contained therein. Magazine 12 may be formed of any suitable metallic or nonmetallic material, although it is contemplated that it be molded from an anti-electrostatic discharge (ESD) polymer, or coated with such a material. As shown, magazine cavity 14 is sized to accommodate a plurality of devices 100 stacked in vertically superimposed relationship. Also as shown, one or more walls of magazine 12 may include an elongated view port 16, so that the filled versus empty status of the magazine may be visually verified as desired. It is also desirable that magazine 12 include a floor 18 movable within interior cavity 14. As shown in FIG. 1A, floor 18 is preferably larger than aperture 14a at the bottom of interior cavity 14, so that devices 100 in magazine 12 will be retained from below by floor 18 when magazine 12 is being handled. As shown in FIG. 1B, floor 18 may include skirts or other peripheral extensions 18a to prevent tilting, cocking and jamming of floor 18 as it moves up and down within magazine cavity 14.

Magazine 12 is placed above an elevation assembly 20 at a fixed vertical level L, and may be stabbed into a fixture, depicted in FIG. 1 as receptacle 22 (shown in broken lines), to provide proper horizontal, vertical and angular (about a vertical axis) orientation for magazine 12. It is preferred, although not required, that magazine 12 be secured against vertical movement by a detent assembly comprised of one or more resiliently-biased detent elements 24 cooperating with a like number of recesses 26 in a sidewall of magazine 12. The detent assembly may comprise a leaf-spring biased detent element as shown, or biasing may be provided by a coil spring, a resilient elastomer, or otherwise as known in the art, or may comprise a resilient wall portion molded into receptacle 22. Alternatively, magazine 12 may be frictionally retained within receptacle 22, or may be positively locked within receptacle 22 by a latch or pin-type locking arrangement, such mechanisms being conventional.

An elongated, rod-like indexing element 30 is extendable upwardly into interior cavity 14 of magazine 12 under the power and control of drive 32, which may comprise a stepper motor, a screw drive, or other suitable incrementally or continuously controllable drive mechanism as known in the art. As shown, indexing element 30 extends vertically through drive 32 and upwardly into magazine 12, where it contacts the bottom of floor 18. As shown in FIGS. 1A and 1B, element 30 may be received within a cup 34 formed in the bottom of floor 18. Cup 34, like skirts 18a, may alleviate any tendency of floor 18 to tilt, cock or jam. If desired, the upper end of indexing element 30 may be of rectangular or other suitable cross section, and the interior blind bore of cup 34 configured to mate therewith. Drive 32 may be controlled responsive to removal or addition of a device to its associated magazine 12 by a pick-and-place mechanism to, respectively, extend or retract indexing element 30 by an increment equivalent to the depth (thickness) of a given device 100. Such movement may be software-controlled for ease of accommodating different devices 100.

Optionally and desirably, each magazine 12 may carry identifying indicia or an identification device thereon to facilitate proper identification and use of a given magazine and its contents. For example, as shown in FIG. 1, magazine 12 may bear an identification device 40 such as a bar code or magnetic strip (such as is employed with credit cards) on an exterior sidewall thereof Alternatively, and again as shown in FIG. 1, magazine 12 may bear a more sophisticated electronic identification device 42 utilizing a memory device such as an EEPROM or flash memory. An RFID (Radio Frequency Identification) device may also be employed for enhanced remote inventory and theft control through electronic tracking or monitoring. Such bar code 40 or identification devices 42 may be employed to retain and provide "bin" information as to the test characteristics exhibited by the binned devices carried by the magazine, part count, manufacturing origin, test date, test equipment, test protocol, and other useful information, such as the location of a specific part in a stack of parts deposited in a given magazine 12.

Figure 2:
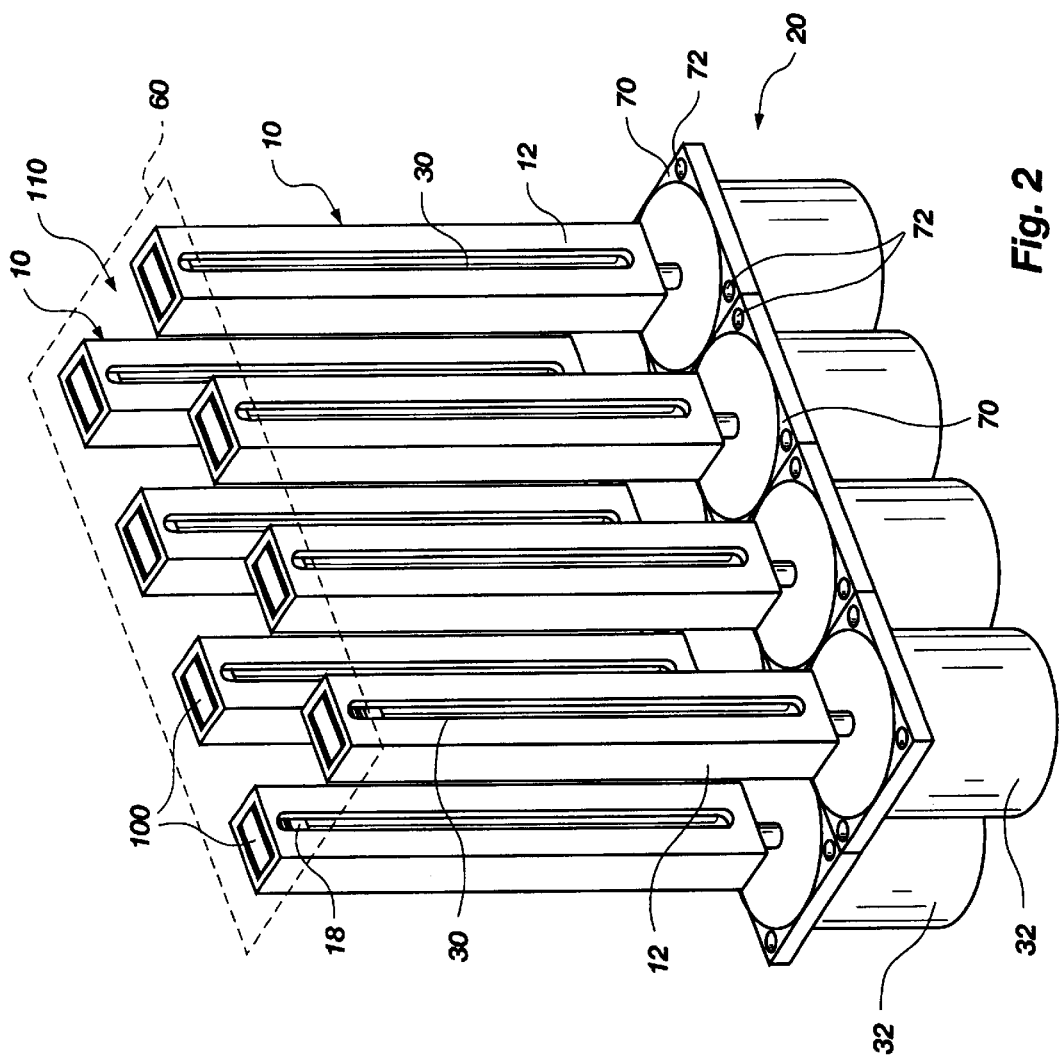
FIG. 2 is a perspective view of a multiple-magazine module embodiment of the invention.

As depicted in FIG. 2, a plurality of magazine units 10, optionally in identical modular form (hereinafter "magazine modules"), may be arranged in a close horizontally-adjacent array 110 to dispense or receive devices 100 in association with a pick-and-place mechanism. This arrangement is particularly beneficial for receiving tested and sorted devices 100, with each magazine 12 of the array 110 comprising a "bin" to receive devices exhibiting particular characteristics under test and sorted accordingly. As shown in broken lines 60, the magazine module array 110 may be arranged to simulate the device containment pattern size and shape of the aforementioned JEDEC trays, while eliminating the previously-described conventional practice of presenting different trays for receiving differently binned devices. Moreover, using the invention, a pick-and-place mechanism may thus be programmed to dispense tested, sorted chips to only one specific X-Y plane (transverse to the axes of magazines 12) location for each sort category, or bin, of tested devices.

Figure 5:
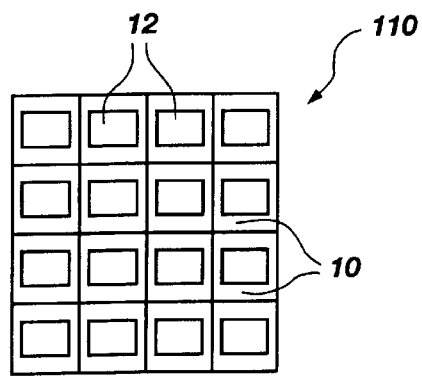
FIG. 5 is a schematic of a square, four magazine module by four magazine module array of one embodiment of the invention.
Figure 6:
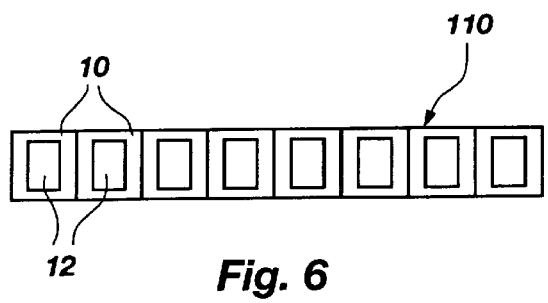
FIG. 6 is a linear, eight magazine module array of one embodiment of the invention.
Figure 7:
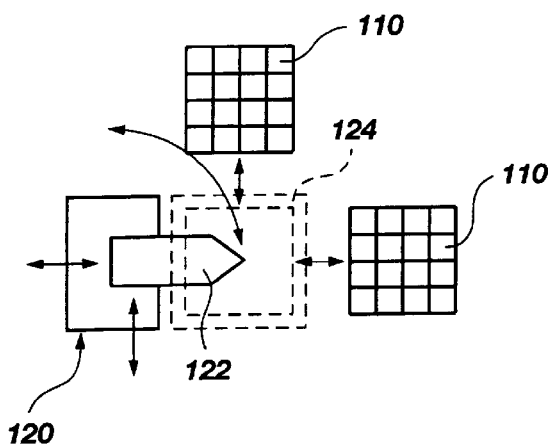
FIG. 7 is a schematic top elevation of two module arrays alternately movable into a target field of a pick-and-place mechanism.
Figure 8:
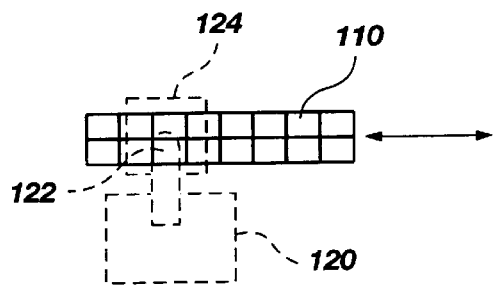
FIG. 8 is a schematic top elevation of an elongated two module-deep linear array translatable across the target field of a pick-and-place mechanism.
Figure 9:
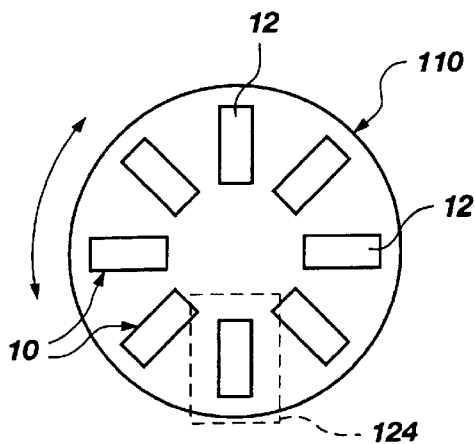
FIG. 9 is a schematic top elevation of a circular, carousel-type array rotatable into the target field of a pick-and-place mechanism.

As desired, the magazine units or modules 10 may be arranged to comprise a square array (for example, four modules 10 by four modules as shown in FIG. 5), another rectangular array (for example, four modules 10 by two modules 10 as shown in FIG. 2), a linear array (for example, a line of eight modules as shown in FIG. 6), or in any other desired arrangement. Further, and again as desired, two or more module arrays 110 may be employed if a large number of bins are required and the pick-and-place device 120 has a limited horizontal travel, the multiple arrays 110 being alternatively placeable within reach of a target field 124 of the pick-and-place arm 122, as shown in FIG. 7. Also, a longitudinally extended module array 110 may be mounted so as to be linearly translatable through a target field 124 of a pick and place arm 122, as shown in FIG. 8. Finally, and as illustrated in FIG. 9, a circular carousel-type array 110 may be employed to rapidly, rotationally present each magazine module 10 at the same, specific, fixed target field 124 for pick-and-place.

As shown in both FIGS. 1 and 2, the magazine modules 10 may be easily bolted or otherwise secured by fasteners to a module or array support plate in any desired pattern and spacing using apertures 72 in flange plates 70 at the tops of drives 32. Alternatively, the magazine modules 10 may be frictionally seated in recesses in a support, spring-loaded or positively-locked clamps may be employed to retain magazine modules 10, resiliently-biased detent devices employed, or any other suitable retention structure known in the art. Further, drives 32 may be linked to a test apparatus and sorting device by quick-release electrical connections (such as male-female connectors, resiliently-biased surface contacts, or other suitable connections known in the art).

When a given magazine 12 is completely filled, such status being conveyed to the operator by, for example, a sensor 50 (see FIG. 1) sensing the position of indexing element 30 or a proximity sensor 52 (see FIG. 1) located on the interior of receptacle 22 sensing the proximity of floor 18 to the bottom of that magazine 12, the full magazine 12 is removed and replaced by an empty one. Triggering of such sensors 50, 52 may result in an alarm or other indicator to alert the operator, and a signal to a control system to stop the binning process until the full magazine is replaced. Position sensor 50 may sense actual travel of indexing element 30, or may merely react to proximity of an indicator located on the shaft of indexing element 30. Proximity sensor 52 may comprise a contact switch, a photocell, a reflection type optical encoder, an ultrasound sensor, or other suitable sensor known in the art. In lieu of being associated with receptacle 22, sensor 52 may be built into the lower end of each magazine 12, and electrical contact for providing power and passing a signal from the sensor made with a host device such as a programmed computer associated (for example) with a testing device or a sorting device when magazine 12 is plugged into receptacle 22. Male\female mating contacts, resiliently-biased surface contacts, or other conventional arrangement may be employed to make the connection.

Position sensor 50 might also be employed to indicate when a dispensing magazine 12 has been emptied (i.e, indexing element 30 is at full extension), and a proximity sensor 52*a* might be employed at the top of each dispensing magazine 12 to signal the proximity of floor 18 to the mouth 14*b* of interior magazine cavity 14, sensor 52*a* having a quick-disconnect electrical connection 54 associated therewith for connecting sensor 52*a* to an alarm or other indicator, to the control for the mechanism being fed by the magazine, and to the control for elevator drive 32. Alternatively, the connection for sensor 52*a* may be located at the bottom of magazine 12 so that entry of the bottom of magazine 12 into a receptacle 22 also effects an electrical connection for the sensor. Further, the sensor may extend longitudinally along the vertical length of the magazine as shown at 52*b*, to sense the proximity of the floor 18 in a continuous manner, and thus the magnitude of the interior cavity 14, of the magazine 12 above floor 18 on a continuous basis. In a very simple form, the "sensor" may comprise a graduated indicator scale 52*c* inscribed on the exterior of magazine 12 next to view port 16 in gradations equal to the thickness of the devices contained therein and numbered to visually indicate the number of devices in the magazine, the remaining magazine capacity, or both. Alternatively, the scale 52*c* may be printed on an adhesive-backed strip or film to be removably adhered to a magazine 12 so that different scales may be used for devices of different thicknesses.

As shown in FIG. 3, the magazine of the present invention may be configured in an embodiment 210 to present or receive a plurality, for example four (4), of devices 100 by employing four interior cavities 14 arranged about a central passage 212 for receiving an indexing element 30, the floors 18 within the four cavities 14 being linked to a central support 214 which is engaged by indexing element 30.

FIG. 4 schematically depicts the dispensing of devices 100 from an array 110*a* of magazine units 10 according to the present invention, retrieval with arm 122*a* of a pick-and-place mechanism 120*a* and placement into a test board preparatory to passage through test apparatus 130 for electrical testing (optionally at elevated temperature) and sorting devices of, 100 as known in the art, retrieval of tested devices 100 with arm 122*b* of, a second pick-and-place mechanism 120*b* and binning of same into additional magazine units 10 in an array 110*b* in accordance with their exhibited test characteristics. Other types of device handling mechanisms may also be employed, and it is specifically contemplated that a translatable chute-type gravity feed mechanism is suitable for dispensing tested devices 100 into various magazines 10 in accordance with their test characteristics. Many types of such electrical tests being known and conventionally practiced in the art, and the type of such tests being unrelated to the present invention and its practice, no further description thereof will be made herein.

The present invention has been disclosed as having specific utility with TSOP devices. However, it is contemplated as having utility with any type of semiconductor device, particularly packaged devices such as (for example) small outline j-lead (SOJ) devices, thin quad flat pack (TQFP) devices, dual-in-line package (DIP) devices, ball grid array (BGA) devices, and chip scale package (CSP) devices.

While the present invention has been described in terms of certain illustrated embodiments, those of ordinary skill in the art will readily recognize that it is not so limited. Many additions, deletions and modifications may be made to the embodiments disclosed, as well as combinations of features from different disclosed embodiments, without departing from the scope of the invention as hereinafter claimed.

What is claimed is:

1. A method of testing and binning a plurality of semiconductor devices, comprising:

testing said plurality of semiconductor devices for selected characteristics;

sorting said tested plurality of semiconductor devices into at least two categories responsive to their exhibited characteristics under test;

placing a first semiconductor device in a first sort category into an upwardly-facing mouth of a first upright, elongated magazine;

supporting said first semiconductor device in said first sort category from below on a floor element movably disposed within said first magazine;

lowering said floor element of said first magazine to lower said first semiconductor device in said first sort category into said first magazine; and placing another semiconductor device in said first sort category in said upwardly-facing mouth of said first magazine on top of said first semiconductor device in said first sort category.

2. The method of claim 1, further comprising:

placing a first semiconductor device in a second sort category into an upwardly-facing mouth of a second upright, elongated magazine; and supporting said first semiconductor device in said second sort category from below on a floor element movably disposed within said second magazine.

3. The method of claim 2, further including lowering said floor element of said second magazine to lower said first semiconductor device in said second sort category into said second magazine, and placing another semiconductor device in said second sort category in said upwardly-facing mouth of said second magazine on top of said first semiconductor device in said second sort category.

4. The method of claim 1, further comprising disposing a plurality of mutually laterally adjacent upright elongated magazines in an array, said plurality of mutually laterally adjacent upright, elongated magazines being at least as great as a number of said sort categories.

5. The method of claim 4, further including placing sorted semiconductor devices into said plurality of mutually laterally adjacent upright, elongated magazines according to said sort categories until at least one magazine of said plurality of mutually laterally adjacent upright, elongated magazines is filled with semiconductor devices of a given sort category, removing said at least one filled magazine and replacing said at least one filled magazine with an empty magazine.

6. A method of binning a plurality of tested semiconductor devices sorted according to exhibited characteristics under test into a plurality of categories, comprising:
    arranging a plurality of upright, elongated magazines in mutual lateral proximity, said plurality of magazines being at least as great as a number of said categories;
    dispensing said plurality of tested semiconductor devices into said plurality of magazines according to said categories, with each magazine of said plurality of magazines receiving sorted semiconductor devices of only a single category;
    contacting from below at least one sorted semiconductor device within at least one magazine of said plurality of magazines with an elevation assembly; and
    regulating an internal volume of said at least one magazine available for receiving said sorted semiconductor devices with said elevation assembly.

7. The method of claim 6, further comprising indexing at least said at least one sorted semiconductor device a specified increment through said at least one magazine with said elevation assembly to effect said regulation of said internal volume of said at least one magazine.

8. The method of claim 6, further comprising labeling said plurality of magazines according to said category of said sorted semiconductor devices contained within said each magazine.

9. A method of binning semiconductor devices sorted into a plurality of categories comprised of:
    providing a plurality of tubular magazines, each magazine of said plurality of tubular magazines orientated along a substantially vertical axis and having an upper opening;
    disposing a first semiconductor device of a first category in said upper opening of one magazine of said plurality of tubular magazines;
    supporting said first semiconductor device of said first category from below on a support structure movable through said one magazine; and
    moving said support structure of said one magazine to move said first semiconductor device of said first category away from said upper opening of said one magazine.

10. The method of claim 9, wherein said moving said support structure of said one magazine to move said first semiconductor device of said first category away from said upper opening of said one magazine comprises;
    providing an indexing element associated with said support structure of said one magazine; and
    indexing said support structure of said one magazine a distance approximately equal to a thickness of said semiconductor devices.

11. The method of claim 9, further comprising:
    disposing a second semiconductor device of said first category in said upper opening of said one magazine;
    placing said second semiconductor device of said first category on top of said first semiconductor device of said first category to form a stack of semiconductor devices of said first category; and
    moving said support structure of said one magazine to move said stack of semiconductor devices of said first category away from, said upper opening of said one magazine.

12. The method of claim 11, wherein said forming a stack of semiconductor devices of said first category comprises forming a stack of at least three said semiconductor devices of said first category.

13. The method of claim 9, further comprising sensing a position of said first semiconductor device of said first category within said one magazine.

14. The method of claim 11, further comprising sensing a number of said semiconductor devices in said stack of semiconductor devices of said first category.

15. The method of claim 9, wherein supporting said first semiconductor device of said first category from below on said support structure comprises supporting said first semiconductor device substantially perpendicular to said vertical axis.

16. A method of binning semiconductor devices sorted into a plurality of categories comprising:
    providing a plurality of tubular magazines, each magazine of said plurality of tubular magazines orientated along a substantially vertical axis and having a top surface, said each magazine including a plurality of internal cavities orientated generally parallel to said vertical axis;
    disposing a first semiconductor device of a first category in a mouth of a first internal cavity of said plurality of internal cavities of a first magazine of said plurality of magazines, said mouth of said first internal cavity opening to said top surface of said first magazine;
    placing said first semiconductor device of said first category on a support structure movable through said plurality of internal cavities of said first magazine;
    disposing at least one other semiconductor device of said first category in a mouth of a second internal cavity of said plurality of internal cavities of said first magazine, said mouth of said second internal cavity opening to said too surface of said first magazine;
    placing said at least one other semiconductor device of said first category on said support structure of said first magazine; and
    moving said support structure to move said first semiconductor device and said at least one other semiconductor device of said first category away from said top surface of said first magazine.

17. The method of claim 16, wherein said moving said support structure to move said first semiconductor device and said at least one other semiconductor of said first category away from said top surface of said first magazine comprises:

providing an indexing element associates with said support structure; and indexing said support structure a distance approximately equal to a thickness of said semiconductor devices.

18. The method of claim 16, further comprising:

disposing a third semiconductor device of said first category in said mouth of said first internal cavity of said first magazine on top of said first semiconductor device to form a first stack of semiconductor devices of said first category;

disposing a fourth semiconductor device of said first category in said mouth of said second internal cavity of said fist magazine on top of said at least one other semiconductor device to form a second stack of semiconductor devices of said first category; and moving said support structure to move said first stack of semiconductor devices of said first category and said second stack of semiconductor devices of said first category away from said top surface of said first magazine.

19. The method of claim 18, wherein:

said forming a first stack of semiconductor devices of said first category comprises forming a stack of at least three said semiconductor devices of said first category; and said forming a second stack of semiconductor devices of said first category comprises forming a stack of at least three said semiconductor devices of said first category.

20. The method of claim 16, further comprising:

disposing a third semiconductor device of said first category in a mouth of a third internal cavity of said plurality of internal cavities of said first magazine, said mouth of said third internal cavity opening to said top surface of said first magazine;

placing said third semiconductor device of said first category on said support structure of said first magazine;

disposing a fourth semiconductor device of said first category in a mouth of a fourth internal cavity of said plurality of internal cavities of said first magazine, said mouth of said fourth internal cavity opening to said top surface of said first magazine; and placing said fourth semiconductor device of said first category on said support structure of said first magazine;

wherein said act of moving said support structure to move said first semiconductor device and said at least one other semiconductor device of said first category further comprises moving said third semiconductor device and said fourth semiconductor device of said first category away from said top surface of said first magazine.

21. The method of claim 16, further comprising:

disposing a first semiconductor device of a second category in a mouth of a first internal cavity of said plurality of internal cavities of a second magazine of said plurality of tubular magazines, said mouth of said first internal cavity opening to said top surface of said second magazine;

placing said first semiconductor device of said second category on a support structure movable through said plurality of internal cavities of said second magazine; and moving said support structure of said second magazine to move said first semiconductor device of said second category away from said top surface of said second magazine.

22. The method of claim 21, further comprising:

disposing a second-semiconductor device of said second category in said mouth of said first internal cavity of said second magazine on top of said first semiconductor device of said second category to form a stack of semiconductor devices of said second category; and moving said support structure of said second magazine to move said stack of semiconductor devices of said second category away from said top surface of said second magazine.

23. The method of claim 22, wherein said forming a stack of semiconductor devices of said second category comprises forming a stack of at least three said semiconductor devices of said second category.

* * * * *

UNITED STATES PATENT AND TRADEMARK OFFICE
CERTIFICATE OF CORRECTION

PATENT NO.    : 6,135,291
DATED         : October 24, 2000
INVENTOR(S)   : Canella It is certified that error appears in the above-identified patent and that said Letters Patent is hereby corrected as shown below:

<u>Title page,</u>
Item [56], References Cited, change "Ishi" to -- Ishii --.

<u>Column 2,</u>
Lines 33-34, change "pick and place" to -- pick-and-place --;

<u>Column 3,</u>
Line 23, change "cross section" to -- cross-section --;

<u>Column 4,</u>
Line 6, change "cross section" to -- cross-section --;
Line 67, change "pick and place" to -- pick-and-place --;

<u>Column 5,</u>
Line 34, before "sensor 52" insert -- proximity --;

<u>Column 6,</u>
Line 8, after "four" insert -- interior --;
Line 13, after "test board" insert -- 128 --;
Line 15, after "sorting" insert -- of --;
Line 16, after "devices" delete "of,";
Line 17, after "of" delete ","; and
Line 24, change "magazines 10" to -- magazines 12 --.

<u>Column 7,</u>
Line 12, after "upright"insert -- , --;
Line 47, before "category" insert -- single --;
Line 51, after "categories" insert -- , --;

<u>Column 8,</u>
Line 2, change ";" to -- : --;
Line 17, after "from" delete ",";
Line 44, after "plurality of" insert -- tubular --;
Line 54, change "too" to -- top --;

UNITED STATES PATENT AND TRADEMARK OFFICE
CERTIFICATE OF CORRECTION

PATENT NO.   : 6,135,291
DATED        : October 24, 2000
INVENTOR(S)  : Canella

It is certified that error appears in the above-identified patent and that said Letters Patent is hereby corrected as shown below:

Column 9,
Line 1, change "associates" to -- associated --;
Line 13, change "fist" to -- first --;
Line 22, change "a" to -- said --;
Line 25, change "a" to -- said --;
Line 26, change "a" to -- another --; and Column 10,
Line 36, change "a" to -- said --.

Signed and Sealed this

Nineteenth Day of November, 2002

*Attest:*

JAMES E. ROGAN
*Attesting Officer*   *Director of the United States Patent and Trademark Office*